(12) United States Patent
Kallam et al.

(10) Patent No.: US 10,541,708 B1
(45) Date of Patent: Jan. 21, 2020

(54) DECOMPRESSION ENGINE FOR EXECUTABLE MICROCONTROLLER CODE

(71) Applicant: Redpine Signals, Inc., San Jose, CA (US)

(72) Inventors: Subba Reddy Kallam, Sunnyvale, CA (US); Sriram Mudulodu, Hyderabad (IN)

(73) Assignee: Redpine Signals, Inc., San Jose, CA (US)

( * ) Notice: Subject to any disclaimer, the term of this patent is extended or adjusted under 35 U.S.C. 154(b) by 0 days.

(21) Appl. No.: 16/140,526

(22) Filed: Sep. 24, 2018

(51) Int. Cl.
| H03M 7/00 | (2006.01) |
| H03M 7/30 | (2006.01) |
| G06F 9/30 | (2018.01) |
| G06F 9/22 | (2006.01) |
| G06F 16/901 | (2019.01) |

(52) U.S. Cl.
CPC .......... H03M 7/3066 (2013.01); G06F 9/223 (2013.01); G06F 9/3005 (2013.01); G06F 16/901 (2019.01); H03M 7/6005 (2013.01)

(58) Field of Classification Search
CPC .... H03M 7/3066; H03M 7/6005; H03M 5/00; H03M 7/00; G06F 16/901; G06F 9/223; G06F 9/3005

USPC .................................................. 341/50, 51
See application file for complete search history.

(56) References Cited

U.S. PATENT DOCUMENTS

| 8,902,087 | B1 * | 12/2014 | Kozin | ................ | H03M 7/3084 |
| | | | | | 341/51 |
| 9,413,386 | B1 * | 8/2016 | Senior | ................ | H03M 7/3086 |
| 9,858,073 | B2 * | 1/2018 | Maloney | ............ | G06F 9/30043 |
| 9,998,143 | B2 * | 6/2018 | Senior | ................ | H03M 7/3086 |
| 10,044,370 | B1 * | 8/2018 | Pasha | ...................... | H03M 7/30 |
| 2016/0248441 | A1 * | 8/2016 | Senior | ................ | H03M 7/3086 |
| 2017/0093424 | A1 * | 3/2017 | Gopal | ................ | H03M 7/3086 |
| 2017/0187388 | A1 * | 6/2017 | Satpathy | ............ | H03M 7/3082 |

* cited by examiner

*Primary Examiner* — Jean B Jeanglaude
(74) *Attorney, Agent, or Firm* — File-EE-Patents.com; Jay A. Chesavage

(57) ABSTRACT

A code decompression engine reads compressed code from a memory containing a compressed code part and a dictionary part. The compressed code part contains a series of instructions being either an uncompressed instruction preceded by an uncompressed code bit, or a compressed instruction having a compressed code bit followed by a number of segments field followed by segments, followed by a directory index indication a directory location to read. Each segment consists of a mask type, a mask offset, and a mask.

20 Claims, 11 Drawing Sheets

Compressed Code Controller

Prior Art segment mapping of Compressed Code

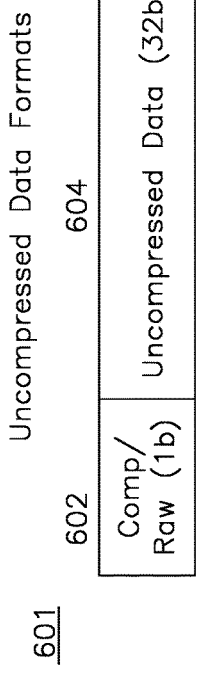
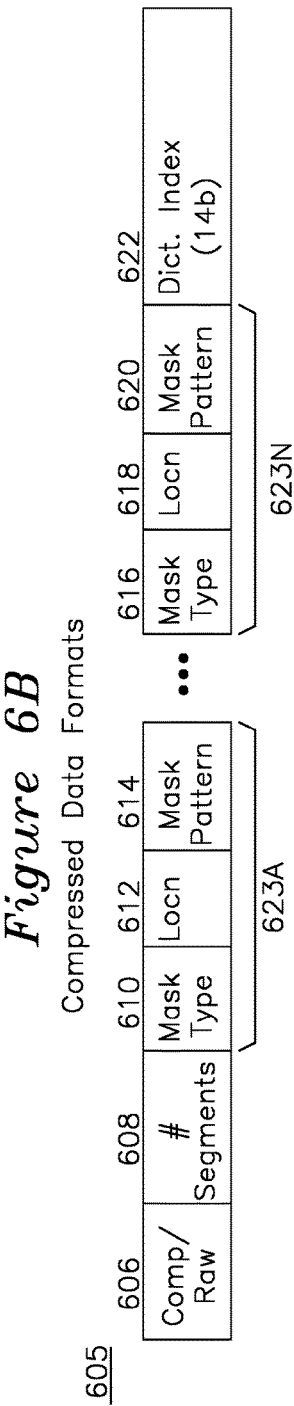

Encoding A (8 bit mask only)

Encoding B (4 bit mask only)

Encoding C (mixture of 4 and 8 bit masks)

Figure 6F

Compressed Instruction Example (4b/8b mask)

| # | Typ | Loc | 4b Mask | Typ | Loc | 8b Mask | Dict Index |
|---|-----|-----|---------|-----|-----|---------|------------|
| 1 | 01 | 10 | 010 | 0011 | 11 | 11 | 00011010 | 0000000000000010 |

631 → row 1
630 → table
632 → {Typ Loc 4b Mask}
634 → {Typ Loc 8b Mask}
636 → Dict Index Dictionary Value

| Index | |
|-------|---|
| 0 | 1111 0101 0000 1011 0000 1100 1011 0000 |
| 1 | 0110 1100 1011 0110 1111 0101 0000 1011 |
| 2 | 0101 0110 1100 1011 0000 1011 1011 1111 | ← 638 |
| 3 | 0001 1011 0101 0110 1011 1100 1011 0000 |
| 4 | 1100 1011 0000 1111 0101 1011 1011 0110 |

Figure 6G example decompression:

632: Encoding 2 (4b); locn 2, mask 0011

0101 0110 1100 1011 0000 0000 1011 1111 ← 638
     641 → 0011              0001 1010 ← 642
0101 0110 1111 1011 0000 0000 1010 0101 ← 644

Figure 6H
Combined Compression/Ext
Branch/Word aligned target address

| | H2 | H1 | H0 | |
|---|---|---|---|---|
| 650 | 1 | | | [608][623A..623N][622] Compressed Inst |
| 652 | 0 | 1 | | [604] Uncompressed Branch Inst |
| 654 | 0 | 0 | 0 | [655] Extended Branch Offset |
| 656 | 0 | 0 | 1 | [657] Pad Instruction |

Figure 6I
Combined Compression/Ext
Branch/Bit aligned target address

| | H1 | H0 | | |
|---|---|---|---|---|
| 660 | 1 | | [608][623A..623N][622] Compressed Inst | |
| 662 | 0 | 0 | [604] Uncomp Branch Inst | [663] bit offset |
| 664 | 0 | 1 | [655] Extended Branch Offset | |

Decompression Engine Process

Uncompressed Branch w/word granularity to Target

Uncompressed Branch w/bit granularity to Target

Native ARM branch instruction bit-granular ARM branch instruction

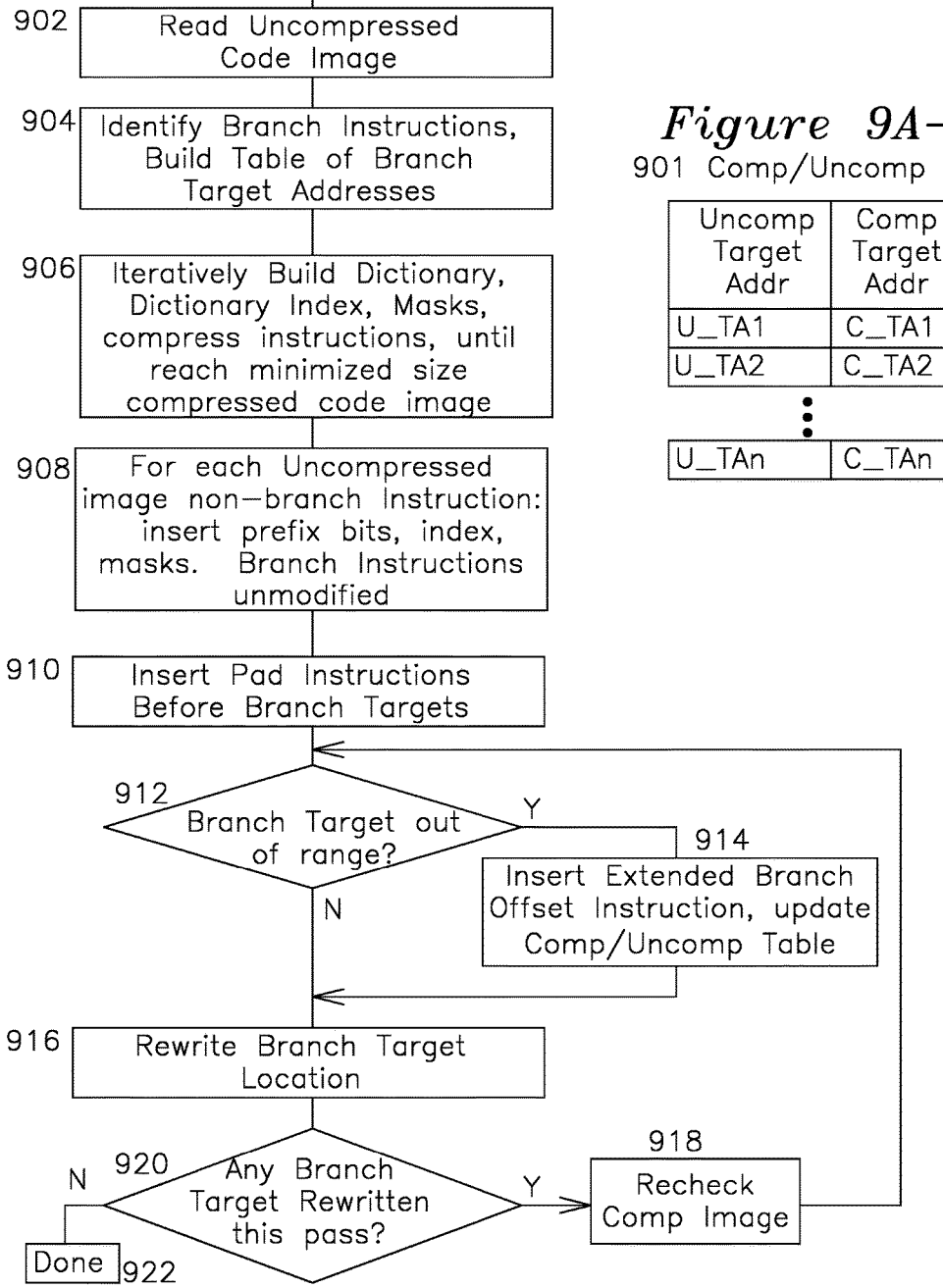

Compressed Image Process of Uncompressed Code (Branch with bit-granularity Target Address)

DECOMPRESSION ENGINE FOR EXECUTABLE MICROCONTROLLER CODE

FIELD OF THE INVENTION

The present invention relates to a code decompression apparatus and method. In particular, the present invention provides a decompression engine which receives requests for executable processor code and data by providing an input address from an embedded processor and returning the executable code or data of the requested address, while maintaining the stored code in a compressed form in local storage.

BACKGROUND OF THE INVENTION

Lossless compression provides for significant reductions in the size of executable instructions stored in memory, also known as executable image files. Lossless compression techniques typically utilize an associative table which contains repeating bit patterns found in the file to be compressed, and which is accessed by bit patterns which reference the associative table. In this method, a file is compressed by analyzing for repeating binary patterns, and those patterns are added to a dictionary, and then the dictionary is referenced by those patterns by the index offset. The bit patterns stored are typically of variable length, and may be stored as a tree with references to the nodes and subnodes of the patterns of interest. In this method, one index may represent a 16 bit value of a tree, and another table entry may represent a 256 bit value of a different tree. In this manner, repeated occurrences of the sequences found in the file may be represented by a references to the index only. One such prior art method for lossless compression is Huffman coding, where the binary file is examined for occurrences of various strings of 1s and 0s, which are expressed as a tree which can be addressed by its values. Another similar compression method is the "zip" file format using the Ziv-Lempel-Welch (ZLW) compression, one example implementation is described in U.S. Pat. No. 4,558,302.

While the compressed image may be significantly smaller than the original uncompressed file, in the prior art, a CPU executing instructions from the compressed file must first decompress the entire file, and it is not possible to decompress instructions from a random starting point in the file, as required by a branch instruction from a CPU. FIG. 1A shows executable code instructions 100 subjected to lossless compression 102 to form a compressed file 104. FIG. 1B shows the file 104 decompressed using lossless expansion 106 which decompresses the file in a symmetric manner as compression step 102, resulting in a faithful reproduction of the original file 108 matching 100. FIG. 2 shows an embedded processor 202 with flash memory storage 204 containing a compressed image, and random access memory (RAM) 206 which contains the uncompressed image. In one prior art system, the compressed image is saved in flash memory 204 and decompressed into RAM 206, where the CPU executes the uncompressed original program instructions from RAM 206. If the compression ratio is 4:1, such that the compressed image is 25% of the size of the original uncompressed file, then the disadvantage of this approach is that RAM 206 must be four times the size of flash memory 204.

One problem of decoding compressed images is that the symbol boundaries from one compressed opcode to another are of variable length, so it is not possible to access a particular part of the compressed file in a granular manner to decompress a particular instruction without starting from an initial compression entry point and decompressing the successive values to maintain synchronization with the preceding symbols and retrieve the desired symbol for decompression into the desired opcode. One prior art approach is to compress the executable code into a series of segments, each segment starting from a landing target for a branch instruction and ending before a branch instruction, such as series of fixed length segments 416 shown in FIG. 4. This decompression method maps an incoming CPU address 408 into a look-up table LUT 404, which identifies the particular segment which contains the data for this address, which is passed as a segment number 412 from the LUT 404 along with an offset value, after which the compressed segment is retrieved from flash memory 416 and sent as data 414, the segment is decompressed by decompressor 406, and the particular offset is used to identify the desired value from the series of decompressed CPU instructions, which are presented as opcode CPU data 410. The memory requirements of the prior art system of FIG. 4 are reduced over the wholesale decompression of the image into Random Access Memory (RAM) of FIG. 2, but the use of multiple segments and look-up table 404 still requires an undesired level of overhead.

Another problem of decompressing an image into memory is that it increases the execution memory requirement. Further, when a jump or branch instruction is encountered, the execution resumes at an address which is either a relative address (with relation to the current instruction), or it is an absolute address. For either the relative or absolute address target for next instruction execution, the problem remains that the compression methods of the prior art provide variable compression ratios on an instruction by instruction basis, so it is indeterminate as to what address to branch in the compressed code, since the compression of the corrected branch address into compressed code may result in different length than the uncorrected branch location, resulting in a non-converging branch address over iterations of compression attempts. Further, if an offset value is provided to compensate, the offset value itself may compress differently, resulting in a different offset value needed, which results in a non-converging solution to the offset value.

It is desired to provide an apparatus and method for decompression of executable code without the overhead of a look-up table or the use of indeterminate or non-converging offset values where branch instructions are present.

OBJECTS OF THE INVENTION

A first object of the invention is an apparatus and method for decompression of executable code stored as a dictionary part and a compressed code part, the compressed code part comprising an optional compressed/raw bit, a number of segments value, and a plurality of segments, each segment containing a mask type, mask location, and mask pattern, the plurality of segments followed by an index into the dictionary part, where the uncompressed code is formed by reading the dictionary value corresponding to the location in the dictionary referenced by the dictionary index, thereafter applying each of the mask types and mask patterns in the location indicated for each mask pattern of each segment, thereby forming an uncompressed instruction or data value.

A second object of the invention is an apparatus and method for decompression of executable code stored as a dictionary part and a compressed code part, the compressed code part having branch instruction landing points which are adjusted to word justified locations in the compressed code part by the addition of an offset which results in the compressed code branch providing the corresponding location of an uncompressed code branch.

A third object of the invention is an apparatus and method for the generation of compressed code from uncompressed code, the apparatus and method examining the uncompressed code for a set of dictionary values which require a minimum number of mask segments indicating groups of bits to be changed to form uncompressed code values from dictionary values plus mask segments, thereafter storing the dictionary entries in a dictionary part and compressed code comprising at least one segment having a mask type, mask location, and mask pattern and an index to the dictionary indicating which dictionary entry in the compressed code part.

SUMMARY OF THE INVENTION

In one example of the invention, a code compression engine reads a compressed instruction file, the instruction file comprising a series of entries, each entry being a compressed instruction and having a field indicating a number of segments which follow, each segment comprising a mask type, a mask pattern, and a location to apply the mask, the segments followed by an index value which indicates a location in a dictionary retrieve an uncorrected instruction value, thereafter apply the masks such as using exclusive OR binary function to form a corrected value, thereafter passing the corrected instruction value to the requesting processor.

In another example of the invention, a code compression engine provided with executable computer processor instructions forms a compressed image by analyzing the executable instructions for branch destination points, and modifies the branch instructions to either be uncompressed format branch instructions, or include a small offset value which is added or subtracted from a specified branch destination addressed associated with the branch instruction.

In another example of the invention, a code compression engine examines executable code, builds a table of entries which can be modified to a desired value using an exclusive OR (XOR) function in combination with a mask, where the mask is applied using 1 bit hamming distance which can correct the dictionary entry within specified groups (such as 4 or 8 bit groups) when applied to a dictionary entry addressable by index. The code compression engine next forms compressed executable instructions from the dictionary and a sequence of compressed instructions, each of which references a dictionary entry and includes segments, each segment having a mask and position the mask and position specifying the bits to modify and the position of those bits.

During a branch adjustment step of a code compression engine, the code compression engine identifies branch labels and places them on addressable boundaries, also adjusting branch instruction to include an offset value to be added to the branch address value (relative or absolute) to ensure the branch is to the desired address. The offset is done in the compressed image by introducing an offset value from the previously stored compressed opcode to an address boundary, and further replaces each branch destination address of the uncompressed code with a corresponding branch destination address for the compressed code. In this manner, references to addresses in compressed code branch instructions now correspond to retrievable addresses in the compressed code memory upon decompression of the associated opcodes. When the address requests are sequential, the controller delivers subsequent decompressed symbols from the compressed file which are expanded to the original opcode instructions of the uncompressed file, and when a non-sequential address request is made (such as occurs with a relative address or absolute address branch), the non-sequential address is passed along to the compressed image storage, where it now corresponds to the compressed instruction to be retrieved, decompressed, and executed. In this manner, the code stored in the flash memory remains compressed, providing efficiency of storage, and the CPU receives decompressed original instructions for sequential instructions or after a branch operation for efficiency in execution of those instructions.

BRIEF DESCRIPTION OF THE DRAWINGS

FIG. 6A shows a diagram of an uncompressed data frame.

FIG. 6B shows a diagram of an example generalized compressed data format

FIG. 6B-1 shows a table of example mask types.

FIG. 6B-2 shows a diagram of memory having a dictionary part and compressed instruction part comprising a series of entries addressable by a dictionary index of FIG. 6B.

FIGS. 6F and 6G show an example decompression of a compressed instruction using a method of the present invention.

FIGS. 6H and 6I show prefix bits for two storage methods corresponding to FIGS. 8A and 8B, respectively.

FIGS. 9A and 9B show flowcharts for compression of an executable image corresponding to the compressed files of FIGS. 8A and 8B.

FIG. 9A-1 shows a table of uncompressed and compressed target addresses.

DETAILED DESCRIPTION OF THE INVENTION

Figure 3:
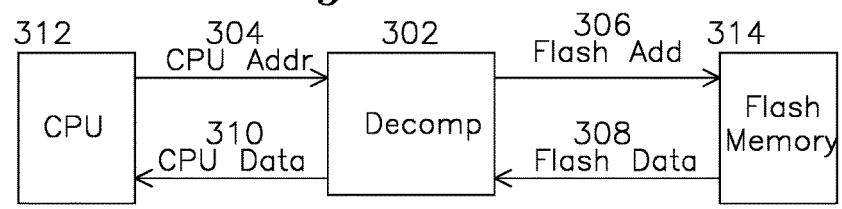
FIG. 3 is a decompression controller for a CPU accessing flash memory with a compressed image.
Figure 4:
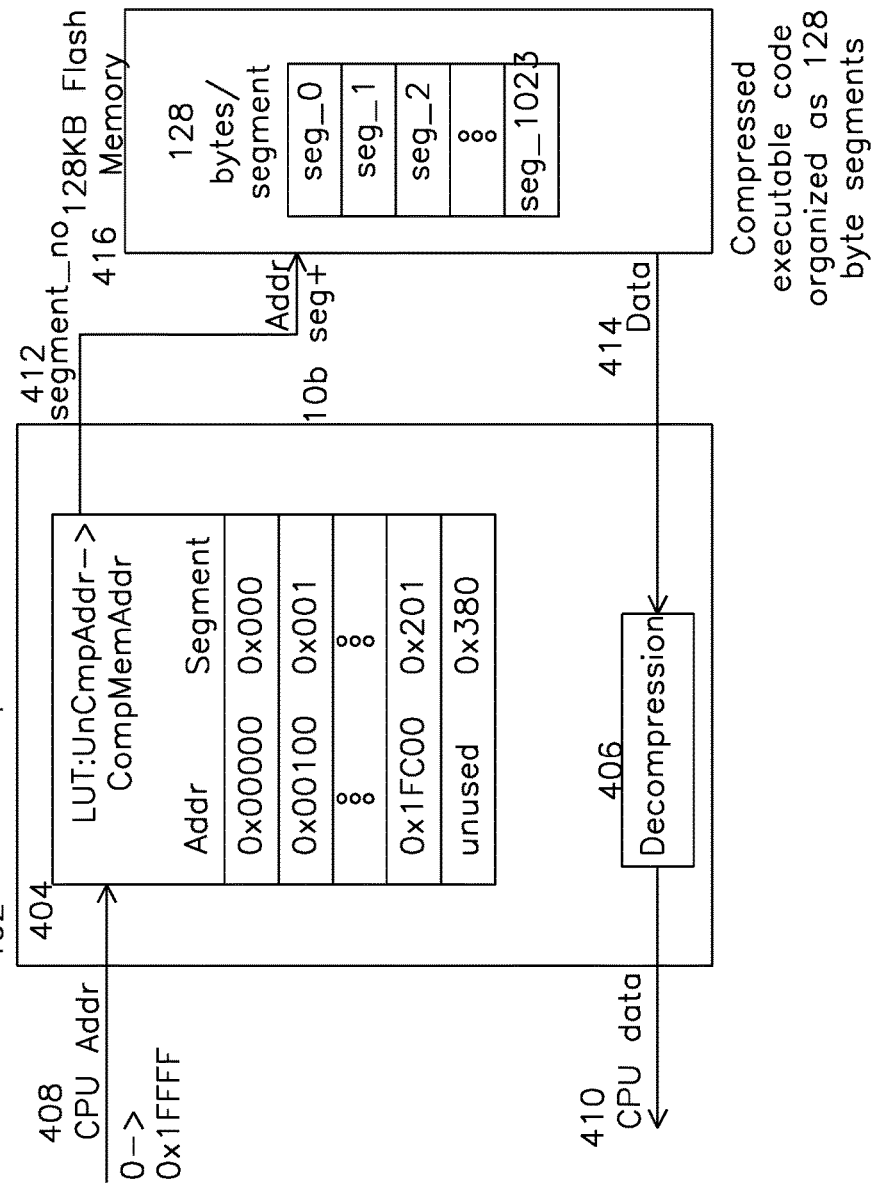
FIG. 4 is a block diagram for a prior art decompression engine using compressed code segments.

The system shown in FIG. 3 provides a decompression engine 302 coupled to CPU 312, which requests an address 304, the decompression engine 302 converts this to an address 306, receives associated data 308, decompresses it, and passes it to the CPU as CPU data 310. The memory 314 may be flash memory in one example of the invention. Note that in the present patent application, references numbers to a particular structure are used to invoke the function of the same structure in other figures.

Figure 5:
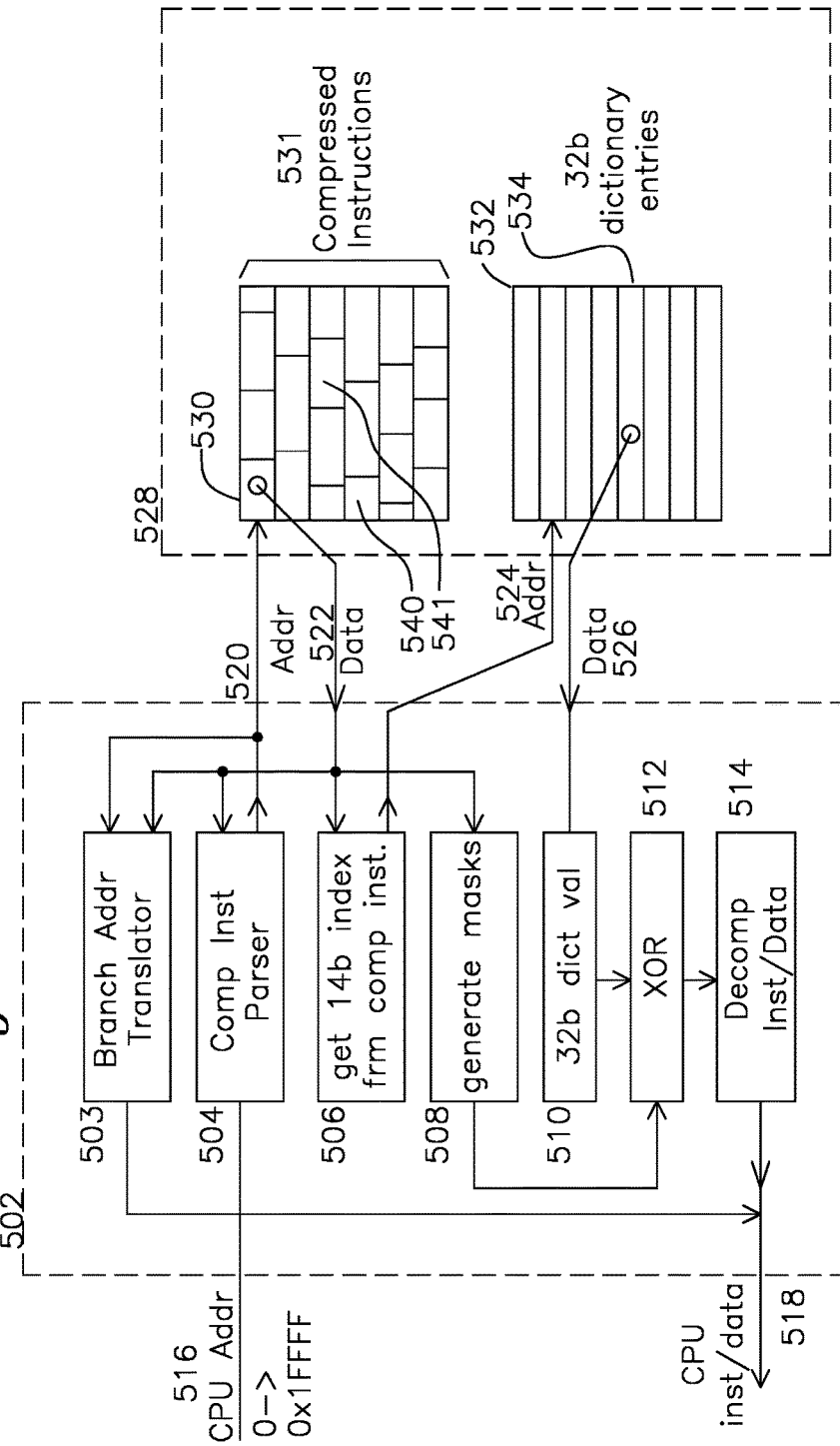
FIG. 5 is a block diagram for a compressed code controller for converting CPU addresses to CPU instructions.

FIG. 5 shows a compressed code controller 502 coupled to memory 528, which in practice is a single memory device, but is shown as two blocks comprising compressed instructions 531 (having irregular boundaries between compressed instructions) and 32 bit dictionary entries 532 with fixed width entries for clarity. Other variations of memory width may be practiced, the present 32 bit examples are provided only for understanding the invention. A CPU address 516 is applied to compressed instruction parser 504, which determines the length and type of each instruction as shown in FIG. 6B, including number of modifications and masks, provides output 520 to a compressed instruction 530 in compressed instructions 531. The compressed instruction data 522 is returned to controllers 506 and 508 which extract the dictionary index pointer 524 and masks 508 from the compressed instruction, respectively. The masks 508 from the segments of the compressed instruction are exclusive ORed (XOR) 512 with the dictionary entry 526 corresponding to the address of compressed code index 524 to form decompressed instruction or data 514, which is provided as output 518 to the CPU as the data/instruction corresponding to the requested address 516.

Figure 2:
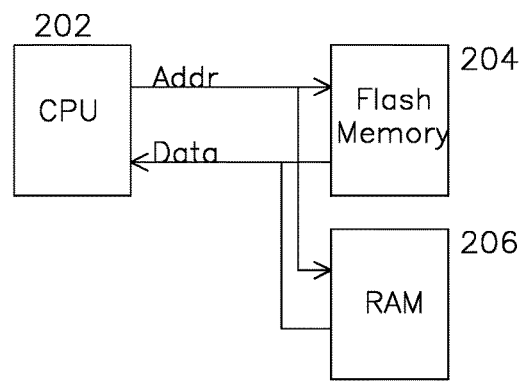
FIG. 2 is a block diagram for a prior art CPU with flash memory and random access memory (RAM).

FIGS. 6A and 6B show two basic formats for processor instruction storage, a most significant bit 602 has a first value such as 0 for uncompressed 32 bit data as shown in FIG. 6A, or a second value 1 606 for compressed data as shown in FIG. 6B, each format representing an uncompressed or compressed single machine instruction or data, respectively. The uncompressed data of FIG. 6A may be read from the data which follows directly and passed to the processor directly in a null operation which doesn't change its value, whereas the compressed instruction format of FIG. 6B undergoes some processing prior to delivery to the processor. In the format of FIG. 6B, the first bit 606 indicating a compressed data type is followed by a field 608 indicating the number of segments 623A to 623N which follow, each pattern comprising a mask type 610 (or 616), location 612 (or 618), and mask pattern 614 (or 620), with the final field being a dictionary index pointer 622 into the dictionary of 32 bit instructions before modification. Each machine instruction is formed by performing the specified mask operations of each segment on the 32 bit data value recovered from the dictionary. The overall arrangement of dictionary 626 and compressed machine instructions 628 is shown in memory 624 of FIG. 6B-2, where a series of dictionary entries 626 is referenced by an index value (622 of FIG. 6B), followed by the compressed instruction/data fields 628, comprising a series of compressed instruction/data fields (of type 601 or 605) of varying length, since the formats of figures and 6B provides a varying number of masks.

Figure 6C:
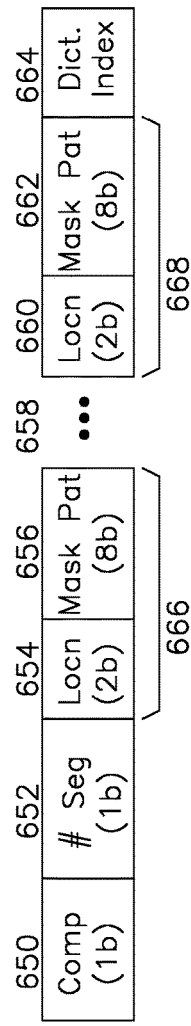
FIGS. 6C, 6D, and 6E show diagrams for three possible compressed instruction encodings.
Figure 6D:
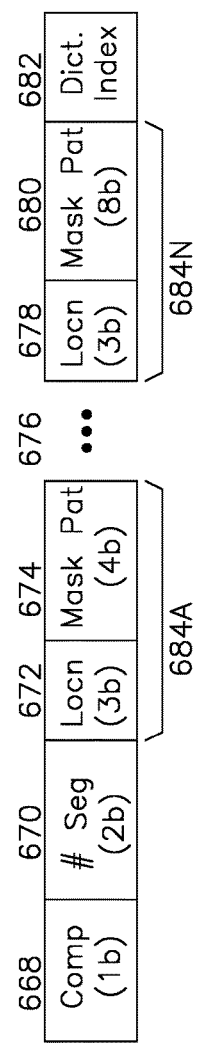

As an example of operation, the decompression controller converts an address provided by a processor to a 32 bit instruction or data value (as it would using a conventional memory device) by reading from the compressed instructions I0, I1, I2, etc stored in 628 by index value in dictionary 626, each of which is in the form shown in FIG. 6A (uncompressed) or 6B (compressed). For compressed instruction format of FIG. 6B, particular compression types are shown in FIGS. 6C (Encoding A, one or more 8 bit masks), 6D (Encoding B, one or more 4 bit masks), and 6E (Encoding C, a mixture of 4 and 8 bit masks). Each encoding type of encoding A, encoding B, and encoding C is operative by referencing a 32 bit value in the dictionary pointed to by the dictionary index 664, 682, 698, respectively, which is 14 bit length of an example 16,384 word memory, each word being 4 bytes or 32 bits of the present example. For each type of encoding, each encoding has a corresponding mask pattern 656, 662; 674, 680; and 692, 697, the mask being a value which is exclusive ORed on a bit by bit basis with a corresponding part of the 32 bit data retrieved from the dictionary index part, where the location is specified by 654 and 660; 672 and 678; 690 and 696 for each mask and encoding, respectively. The binary exclusive OR (XOR) operation with 1 changes a 1 to 0 and 0 to 1, and the exclusive OR operation with 0 does not change the bit value. In this manner, the mask patterns shown may be selective on the 32 bit dictionary data 626 on a bit by bit basis, although the number of masks may typically be 1 or 2 8 bit masks for encoding A of FIG. 6C, up to four 4 bit masks for FIG. 6D, and up to 4 masks (4 or 8 bit) for the encoding of FIG. 6E, where the mask type field 688, 694 indicates whether the mask is 4 or 8 bit, and the location 690, 696 indicates the mask position (the mask offset 4 or 8 bits at a time, according to type as 5 or 8 bit mode, respectively. The number of masks is variable and governed by the number of bits in the mask position location (612, 618), which are given as particular lengths in the present example for clarity of the invention, and do not limit the invention to only the example values provided.

Figure 6E:
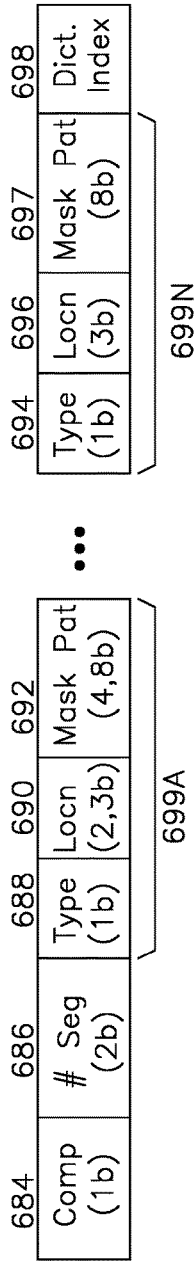

FIG. 6F shows a compressed instruction example, using the 4 bit and 8 bit mask of encoding C of FIG. 6E. Field 630 indicates the instruction is compressed, with length 631 10b (b suffix indicating binary representation of the number) indicating 2 mask segments 632 and 634, and dictionary index 636 '00 0000 0000 0010b' pointing to the second dictionary entry shown as 638, which contains the uncorrected instruction. FIG. 6G shows the uncorrected instruction 638 next to the four bit mask of segment 632 applied in location 010b (2nd four bit location from MSB, where location 000b is the 0th 4 bit location starting from the MSB. In the present example, the locations are identified as follows for a 32 bit instruction of the form [b31 . . . b0]:

4 bit mask location for location (decimal):mask bits
    0:[b31 . . . b28]
    1:[b27:b24]
    2:[b23:b20]
    3:[b19:b16]
    4[b15:b12]
    5:[b11:b8]
    6:[b7:b4]
    7[b3:b0]

8 bit mask location for location:mask bits
    0:[b31 . . . b24]
    1:[b23:b16]
    2:[b15:b8]
    3:[b7:b0]

Accordingly, first segment 632 mask '0011b' is applied in location '010b' corresponding to [b23:b20], and second 634 mask '0001 1010b' is applied 640 to location 11b (3 decimal) corresponding to [b7:b0] of 640. After an exclusive OR with the dictionary uncompressed instruction 638 with the masks 641 and 642, the corrected uncompressed instruction 644 '0101 0110 111 1011 0000 0000 1010 0101b' is delivered to the processor as the instruction or data corresponding to the requested address.

FIG. 6H and FIG. 6I show example prefix bits for two example compression methods. FIG. 6H shows four types of encoded instructions 650, 652, 654, 656 for expansion by the decompression engine, each of which has one (H2) or three (H2, H1, H0) bits of prefix. A "1" bit H2 of 650 indicates the instruction is compressed, following the example of FIG. 6B, with subsequent fields 608, 623A through 623N, and 622 as previously described. Uncompressed instruction 652

("01b" header) indicates an uncompressed branch instruction as described for 604 of FIG. 6A. The branch instruction 604 may be a relative branch (having a signed offset target address parameter with respect to a current address, such as an example 2 or 41 words forward or backward), or it may be an absolute address. Typically, the branch instruction and relative destination address parameter appear together in an example 32 bit processor instruction, however the address range that must be spanned is also 32 bits. Accordingly, the relative branch destination address parameter part of the instruction is limited to the size of the remaining bits of a 32 bit instruction, in the example for an ARM processor, 20 bits are available for relative address parameter of the 32 bit branch instruction. When the branch distance exceeds the range of a relative branch target address parameter, the branch target address may be converted by the compiler to an absolute address, providing a 32 bit value which overcomes the range limitation of relative branch addresses. However, for speed and efficiency purposes, it is often desirable for a relative branch instruction to be used rather than absolute branch instruction. The instruction 654 (with example header "000b") provides an extended branch offset value 655, which may be provided immediately before or after the branch instruction 652. In the case of a branch, the branch offset may then be added to the address emitted by the CPU on the following instruction, the decision to branch being determined by the controller 502 based on a non-sequential address request (a non-branch on a conditional branch instruction results in the sequential address being requested). Another special instruction, the PAD instruction 657 is used to indicate to the parser 504 to retrieve the next instruction from the next word boundary, the PAD instruction is typically used where branch target addresses are word justified, to fill the space between the previous instruction and the branch target address. The PAD instruction 656 has no parameters, the unique example bit combination "001b" of the header bits is interpreted by the instruction parser 504 to retrieve the following instruction from the next word boundary.

FIG. 6I provides the same functionality as FIG. 6H for an alternate embodiment of the invention where the branch instruction 604 is followed by a bit field 663 which is used to give bit-specific target address location in addition to the word boundary instruction of 604. For a 32 bit word boundary, the bit offset field 663 may be 5 bits, thereby providing the start of the target address for a branch on the granularity level of an individual bit. When the branch target address may be specified on the level of an individual bit of the present alternative method, the pad instruction 656 of FIG. 6H is not needed, and the header fields only require H1 and H0 for complete coverage of instruction types as shown in FIG. 6I.

Figure 7:
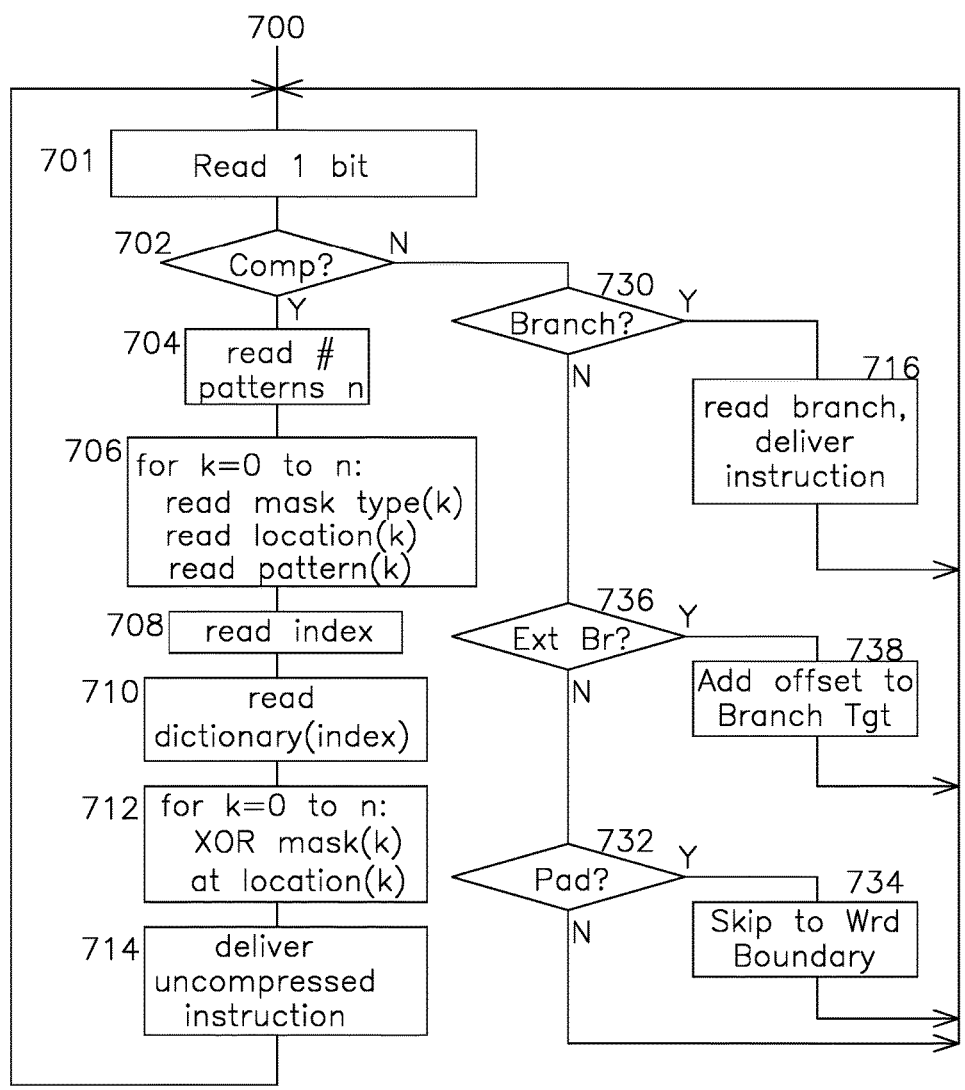
FIG. 7 shows a flowchart for a decompression process.

FIG. 7 shows a processing flowchart, where at entry point 700, a first bit 701 (corresponding to compressed/noncompressed bit 602 of FIG. 6A or 605 of FIG. 6B) is read to determine whether the following data is uncompressed, and if uncompressed, it is thereafter tested (using bits H2, H1, H0 of FIGS. 6H and 6I) for a branch instruction 730, extended branch offset 736, or pad 732, as was described in FIGS. 6H and 6I. In the case 730 of a branch 716 (of FIG. 6A), the uncompressed branch instruction 604 of FIG. 6A is read (alternatively also reading the bit offset of the branch 663 of FIG. 6I) and passed to the CPU on interface 518 of FIG. 5 by the branch address translator 503. In the case where the branch is executed (such as an unconditional branch, or a branch with a condition which is satisfied), the branch execution is detected as a non-sequential subsequent address 516 delivered by the processor, which results in the bit offset field 663 (for the embodiment of FIG. 6I) and previous extended branch offset value 655 being applied on the subsequent instruction fetch by parser 504, resulting in the next instruction after a branch being correctly delivered 518. A PAD header bit pattern H2, H1, H0 which is detected 732 results in the compressed instruction parser 504 advancing to the next word boundary.

In step 702, when the compressed data bit 606 is set, the controller reads the number of n 704 segments (corresponding to field 608 of FIG. 6B), thereafter reading the segments 623A to 623N. Each segment is associated with a mask type, location, and pattern, which are read in step 706 for each segment, followed by the dictionary index field 708 (622 of FIG. 6B), which is a pointer to the dictionary 626 of code memory 624, and the associated uncorrected 32 bit dictionary value of 626 corresponding to the directory pointer 622 is read in step 710. In step 712, the uncorrected value read in step 710 has the mask(k) XORed 712 at the corresponding location(k) for each of the n patterns (623A to 623N), and the resulting corrected data/instruction is delivered to the processor in step 714, continuing to the next data/instruction of step 700.

In another aspect of the invention, a relative or absolute branch instructions (a branch to a target location using an offset address relative to the current address or to a specific address, respectively, may be performed in a variety of different ways.

Figure 8A:
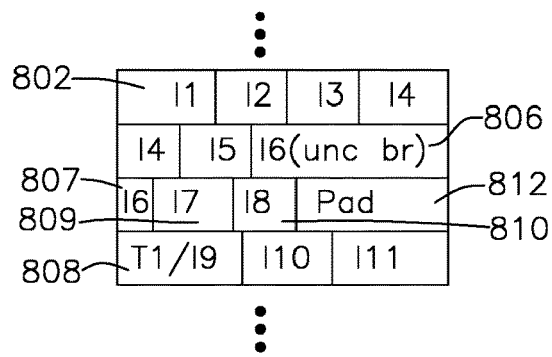
FIGS. 8A and 8B show details of a compressed executable code format for word granularity and bit granularity of branch targets, respectively.

FIG. 8A shows a mixture of compressed instructions (for non-branch operations) and uncompressed instructions (for branching instructions) 531 of FIG. 5 for a first embodiment where target addresses are word boundary oriented (such that execution after a branch begins at the specified target address with word address granularity). In this example, the instructions I1 802, I2, I3, I4, and I5 are parsed as a sequence of compressed instructions by compressed instruction parser 504 executed sequentially as individual compressed instructions of one of the forms of FIG. 6B according to the method described in FIG. 7. The compressed instruction parser 504 determines the length of each instructions so that successive execution of instructions with variable length compressed values may be executed sequentially. For each instruction processed by the compressed instruction parser 504, index pointer is retrieved 506, the instruction associated with the index pointer is retrieved and modified 508, 510 and 512 to form the decompressed instruction or data returned to the CPU 518 as described in FIGS. 6F and 6G. Following the execution of instruction I5, branch instruction 806 is retrieved as an uncompressed format, where the example target address of the branch instruction 806 has been modified during compression to point to the intended target address T1 808. In this example, I6 804 is an uncompressed branch which is 33 bits long (a not_compressed bit 602 plus 32 bits of instruction 604), and extends into the following location 807. Branch instructions are directed to the branch address translator 503, which strips the "uncompressed" bit 820 of FIG. 8C, and passes along the opcode 824 (including conditions CCCC) and branch address 826, which was previously modified during the formation of the compressed code image 531 to point to the target address T1 in the compressed code space 531. A conditional branch may either continue to the next instruction I7 809, or it may jump to the target address T1 and resume execution at T1/I9 808. Since the target T1 with instruction I9 must be on a word boundary for this embodiment (the uncompressed branch instruction I6 is native other than being adjusted for the actual word boundary target address 808 in compressed instruction space corresponding to the T1 location for the uncompressed code image). Because the target T1 808 occurs on a word boundary, a pad 812 is required so that the instruction fetched after I8 810 resumes at the next word boundary at T1 808. The resumption from I8 810 to T1/I9 may be accomplished with pad instruction 812, which is a unique bit pattern which instructs the compressed instruction parser 504 to advance to the next word boundary for the next instruction to execute, in this case T1 808.

Figure 8B:
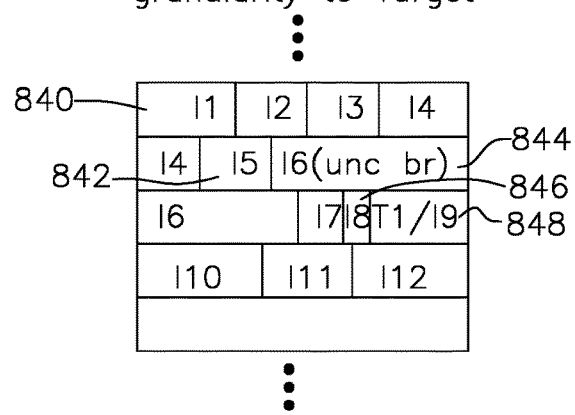
Figure 8C:
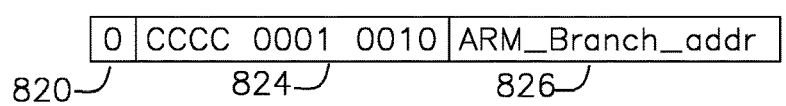
FIGS. 8C and 8D show diagrams of an example ARM processor branch instruction with word granularity of the target address, and an extended offset field for use by a branch processor which provides branch target address with bit-granularity, respectively.

An example ARM processor branch instruction for use in the method of FIG. 8A is shown in FIG. 8C. The branch instruction comprises a not-compressed bit 820 indicating a native instruction, followed by 32 bits of which 4 bits are the branch condition CCCC plus 8 bits of branch opcode '0001 0010b', followed by the branch address 826 which reference a 20 bit offset (left shifted 4 for word boundary to form a 24 bit offset, providing a 32 MB addressing range). An absolute 32 bit target address may be handled by reference to a 32 bit register which is previously initialized with the branch target address.

Figure 8D:
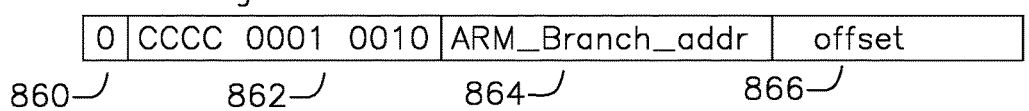

The branch method of FIG. 8A has an inherent inefficiency in that the target address is required to be on a word boundary, which requires post-instruction pad 812, which may cause inefficient compression in certain circumstances. In another example of the invention shown in FIG. 8B, the execution proceeds as before starting with 840 I1, to I5 in sequence, followed by uncompressed branch instruction I6 such as the form shown in FIG. 8D uncompressed branch instruction, having uncompressed bit 860, opcode 862 having a conditional branch part shown as CCCC (4 bits) followed by the branch opcode for ARM '0001 0010b', followed by the branch address 864, followed by a bit-granular offset 866 indicating which bit of the target word location 864 should be read as the target branch instruction. For a 32 bit word size, bit granularity of target branch location adds the burden of only 5 additional bits, thereby allowing branch target T1 848 with instruction I9 848 to follow instruction I8 846 without the requirement of word boundary alignment of the target address T1 848 as was required 808 for FIG. 8A.

In an example of the invention, the branch address translator 503 handles all of the branch instruction modifications, such that the data returned 518 is the 32 bit instruction associated with the target address of the branch instruction.

The pad instruction 812, which is executed after instruction I8 of FIG. 8A causes the compressed instruction parser 504 to fetch the next word-aligned compressed instruction I9 808. The pad instruction 812 may be crafted from a sequence of unique initial bit combinations and placed where required. In the present examples, an uncompressed ARM branch instruction is of the form '0 CCCC 0b' where CCCC may be any condition code. The bit series '0 0000 1b' would uniquely differentiate a pad instruction for interpretation by the compressed instruction parser 504 of FIG. 5, telling the compressed instruction parser 504 to ignore the pad instruction and go to next word boundary address. Accordingly, only the initial 6 bits of this unique bit pattern would be necessary to indicate a pad instruction, with the balance of the bits to the end of the current word being ignored by the branch processor and having arbitrary values.

In another aspect of the invention, a special symbol derived from FIG. 6B may be used to indicate a branch instruction, where field 606 is set to indicate a compressed type, and field 608 is set to indicate 0 masks, indicating a special type of instruction related to a branch instruction. A first field which follows 608 may indicate an index to the branch location, or it may indicate a branch location and an offset.

Figure 1A:
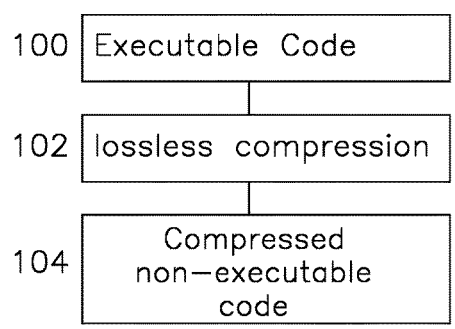
FIG. 1A is flowchart for prior art code compression.
Figure 1B:
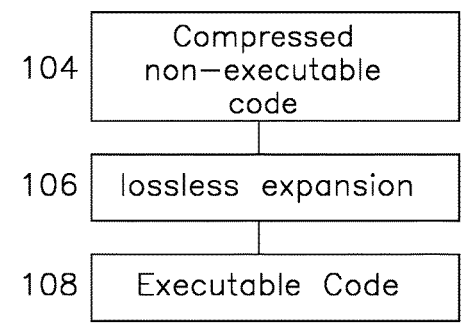
FIG. 1B is a flowchart for prior art code de-compression.

FIG. 9A shows a process for forming the compressed image for execution by the in-line compressed code processor of the present invention, with branch target addresses on word boundaries, as shown in FIGS. 6H and 8A, which required the PAD instruction before a word-aligned branch target address such as 812 prior to 808 of FIG. 8A. The uncompressed code image is read 902 and branch instructions and a table of branch target addresses is formed 904, such as using the table 901 of FIG. 9A-1 with the relationship between uncompressed target address (U_TA1 . . . U_TAn) and compressed target address (C_TA1 . . . C_TAn). As most of the compression ratio results from the selection of the dictionary, dictionary index, and masks, the process of step 906 continues iteratively, searching for the compressed image with the smallest size and associated dictionary entries and masks. This step may be performed using Monte-Carlo techniques, or other methods for forming a candidate dictionary and masks which may be chosen based on a minimum overall compressed image size. The branch instructions remain uncompressed, however the branch target addresses are re-mapped to the compressed code image location for each entry of table 901. Step 908 forms the compressed image by replacing each non-branch instruction or data of the uncompressed image by the compressed format of FIG. 6B, and placing unmodified (and uncompressed branch instructions as shown in FIG. 6A in place of each branch instruction, with the branch target associations in compressed and uncompressed code image maintained as in step 904 (of table 901) for subsequent use. Each branch target is preceded by a pad instruction of step 910 as was described in FIG. 8A with respect to pad instruction 812 preceding branch target 808. In the compressed code image, at each location where a relative branch target is out of range 912, an extended branch offset instruction 914 (such as 654 or 664 of FIG. 6G or 6I) is added to precede the branch instruction, which has a branch target address such that the sum of the branch target instruction and offset point to the target address in the compressed code image, and the uncompressed to compressed association table 901 is adjusted to reflect the extra bits required. The branch target is re-written in step 916 using the table 901, and the process continues with the branch range checked 918 until the compressed image branch instructions are all determined to be in range and not needing the extended branch offset instruction 920 and 918. When no further branch offset instructions are needed and the compressed code image correctly identifies branch targets which are in reach of the respective branches, the process completes 922 with the form of FIG. 8A, which is then ready for execution by the controller of FIG. 5.

Figure 9B:
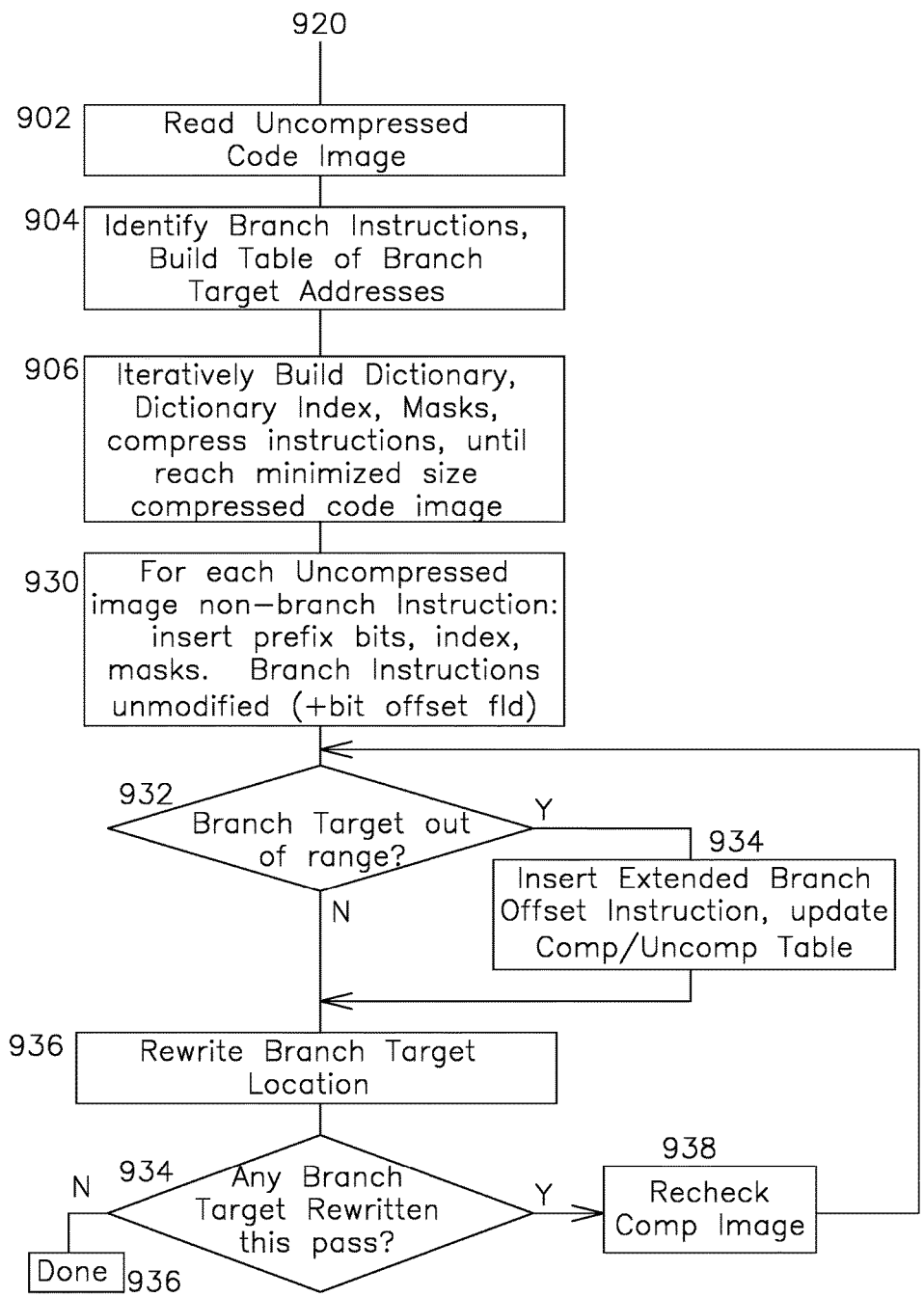

FIG. 9B shows the compressed code image process of FIG. 9A where the branch instruction includes a bit-offset field such as 663 of FIG. 6I. Steps 902, 904, 906, 907, and 908 are as in FIG. 9A, with instruction 930 similar to 910 of FIG. 9A with a bit offset field added to the compressed target address of 901. The branch instruction target address is written in step 930 including the bit offset of 633, such that a PAD instruction is not required since branch instructions now have bit level granularity to target address, rather than word granularity as shown in FIG. 9A. An iterative process of checking for branch targets out of range 932 and needing an extended branch offset instruction 934 are added, with the table 901 of FIG. 9A-1 updated, and associated branch target of the associated branch instruction rewritten in step 936, and the process iterates from the start of the compressed image 928 until no branch targets were rewritten or needed insertion of an extended branch offset instruction in step 934. When no branch compressed target addresses were rewritten because of the addition of an extended branch instruction in step 934, the compressed code image is complete in step 936.

The descriptions provided herein are for understanding the invention only, and do not limit the invention to only the embodiments described. The method for generation of a compressed code image, and the controller for delivering in-line code from the compressed code may be practiced many different ways. The processor is shown as a 32 bit processor in the present examples, but the method is applicable to 64 bit processors, 16 bit processors, or other instruction size, memory size, or instruction set.

We claim:

1. A method for decompression of a compressed code image comprising a dictionary part containing uncorrected instructions and a compressed instruction part, the method comprising:
   reading a sequence of instructions from a compressed instruction part, each compressed instruction comprising:
   a first bit indicating a compressed or uncompressed instruction;
   where, if the first bit indicates an uncompressed instruction, reading a fixed number of subsequent bits and returning the fixed number of subsequent bits as data;
   and where, if the first bit indicates a compressed instruction:
   reading a field indicating the number of segments;
   for each segment, reading a mask and mask location;
   reading an index field;
   reading the dictionary value corresponding to the index field as an uncorrected instruction;
   modifying the uncorrected instruction into a corrected instruction by applying each mask and mask location to the uncorrected instruction.

2. The method of claim 1 where the segment includes a mask and a location.

3. The method of claim 2 where each mask is a 4 bit value or an 8 bit value.

4. The method of claim 2 where each instruction has a bit indicating a compressed or uncompressed instruction.

5. The method of claim 4 where uncompressed instructions are branch instructions.

6. The method of claim 4 where the branch instructions include an address which is a reference to a target address in a compressed code space.

7. A compressed code controller comprising:
   a compressed instruction memory containing mixture of compressed instructions and uncompressed instructions, each compressed instruction or uncompressed instruction identified by a bit accompanying each compressed instruction or uncompressed instruction;
   dictionary entries having a length equal to an uncompressed instruction;
   a compressed instruction parser receiving a CPU address from a processor when the bit indicates a compressed instruction;
   the compressed instruction parser extracting an index pointer, masks, and mask locations and an index pointer;
   an instruction modifier applying masks and mask locations to modify an instruction extracted from a dictionary entry associated with the index pointer.

8. The compressed controller of claim 7 including a branch address translator returning an instruction from a branch target address.

9. The compressed controller of claim 8 where the branch address translator provides a bit-granular fetch address into the compressed instructions.

10. The compressed controller of claim 7 where the compressed instruction translator responds to a pad instruction by fetching the next word boundary compressed instruction.

11. A method for converting an uncompressed executable image having instructions including branch instructions into a compressed image, the method comprising:
    forming a table of uncompressed branch instructions with target branch addresses and all other non-branch instructions or data;
    forming a list of dictionary entries and masks for iteratively changing each dictionary entry into one of the non-branch instructions or data, the list of dictionary entries and masks iteratively formed to a size less than the uncompressed size of dictionary entries and masks;
    forming a list of uncompressed image branch target addresses and associated compressed image branch target addresses;
    forming a list of compressed instructions by translating each uncompressed instruction or data into a dictionary index and optional masks from the dictionary entries;
    for each uncompressed branch target address, substituting a corresponding compressed image branch target address from the table of uncompressed instructions to the list of compressed instructions for each target address.

12. The method of claim 11 where the compressed image branch target address includes a word address and a bit offset.

13. The method of claim 11 where the list of uncompressed instructions includes a PAD instruction following an instruction before a compressed image branch target address.

14. The method of claim 11 where the list of uncompressed instructions includes an extended branch offset instruction which is used in combination with a compressed image target address to reach a branch target address which is unreachable by a branch address of a branch instruction.

15. A controller receiving an address from a processor and delivering corresponding executable code or data for the address, the controller comprising:
    a memory containing compressed executable code, the compressed executable code comprising a dictionary part and a sequence of data, the data being at least one of: an uncompressed branch instruction or a compressed instruction comprising a field identifying a number of segments, each segment comprising a mask type, a mask location for where the mask is to be applied, and a mask pattern, the mask segments followed by a dictionary index referencing the dictionary part;
    a compressed instruction processor identifying compressed instructions or data, the compressed instruction processor retrieving a data entry corresponding to the address, thereafter retrieving the dictionary entry associated with the dictionary index and applying the associated mask patterns in the mask locations, providing the resultant value as the corresponding executable code;

a branch processor identifying branch instructions, the branch processor returning a branch instruction corresponding to the address.

16. The controller of claim 15 where the branch processor receives extended branch instructions and adds a field associated with the extended branch to an address part of the branch instruction when it detects a subsequent address request which is non-sequential from a previous address request.

17. The controller of claim 15 where the compressed instruction processor is responsive to a first bit of each compressed instruction indicating a compressed instruction.

18. The controller of claim 15 where each mask of a mask segment is at least one of a one-bit, two-bit, four-bit, eight-bit, 16-bit, or 32-bit mask and each location of a mask segment indicates where to apply an associated mask to a value retrieved from the dictionary by an associated dictionary index value.

19. The controller of claim 15 where the controller processes a next word boundary compressed instruction or branch instruction upon retrieval of a PAD instruction.

20. The controller of claim 15 where the compressed image processor reads a bit offset as part of an uncompressed branch instruction, the bit offset indicating a bit position of subsequent instruction to retrieve if a branch operation results in a non-sequential subsequent access.

* * * * *